United States Patent
Yamaoka et al.

(10) Patent No.: US 7,498,637 B2
(45) Date of Patent: Mar. 3, 2009

(54) SEMICONDUCTOR MEMORY

(75) Inventors: Masanao Yamaoka, Kodaira (JP);
Kenichi Osada, Tokyo (JP); Kiyoo Itoh,
Higashikurume (JP); Takayuki Kawahara, Higashiyamato (JP)

(73) Assignee: Renesas Technology Corp., Tokyo (JP)

( * ) Notice: Subject to any disclaimer, the term of this patent is extended or adjusted under 35 U.S.C. 154(b) by 361 days.

(21) Appl. No.: 11/151,455

(22) Filed: Jun. 14, 2005

(65) Prior Publication Data

US 2005/0276094 A1    Dec. 15, 2005

(30) Foreign Application Priority Data

Jun. 15, 2004    (JP) .............................. 2004-176669

(51) Int. Cl.
H01L 27/01    (2006.01)
H01L 27/12    (2006.01)
H01L 31/0392    (2006.01)
H01L 27/11    (2006.01)
G11C 11/00    (2006.01)

(52) U.S. Cl. .................... 257/351; 257/350; 257/903; 365/154; 365/156

(58) Field of Classification Search ............... 257/903, 257/904, 350, 351, E27.098, E21.661; 365/154, 365/156
See application file for complete search history.

(56) References Cited

U.S. PATENT DOCUMENTS

| | | | |
|---|---|---|---|
| 5,555,208 A * | 9/1996 | Nishihara | 365/154 |
| 5,986,924 A | 11/1999 | Yamada | 365/154 |
| 6,611,023 B1 * | 8/2003 | En et al. | 257/350 |
| 6,714,439 B2 | 3/2004 | Kobayashi et al. | 365/154 |
| 6,724,065 B2 | 4/2004 | Sato | 257/506 |
| 2002/0113270 A1 * | 8/2002 | Bernstein et al. | 257/369 |
| 2003/0090924 A1 * | 5/2003 | Nii | 365/102 |
| 2003/0113961 A1 * | 6/2003 | Horiuchi et al. | 438/157 |
| 2004/0155281 A1 | 8/2004 | Osada et al. | 257/315 |

FOREIGN PATENT DOCUMENTS

| | | |
|---|---|---|
| JP | 11-016363 | 1/1999 |
| JP | 2000-114399 | 4/2000 |
| JP | 2002-353340 | 12/2002 |
| JP | 2004-207694 | 7/2004 |

OTHER PUBLICATIONS

Weste et al., *Principles of CMOS VLSI Design, A Systems Perspective*, second edition, 1992, pp. 304-307.

* cited by examiner

*Primary Examiner*—Shouxiang Hu
(74) *Attorney, Agent, or Firm*—Miles & Stockbridge P.C.

(57) ABSTRACT

A SRAM memory is composed of FD-SOI transistors, and performance of the memory cell is improved by controlling an electric potential of a layer under a buried oxide film of a SOI transistor constituting a driver transistor. Performance of the SRAM circuit in the low power voltage state is improved. In the SRAM memory cell composed of the FD-SOI transistor, an electric potential of a well under a BOX layer is controlled to control a threshold voltage Vth, thereby increasing a current. Thus, the operations of the memory cell can be stabilized.

3 Claims, 20 Drawing Sheets

SEMICONDUCTOR MEMORY

CLAIM OF PRIORIRY

The present application claims priority from Japanese application JP 2004-176669, filed on Jun. 15, 2004, the contents of which is hereby incorporated by reference into this application.

BACKGROUND OF THE INVENTION

1. Field of the Invention

The present invention relates to a semiconductor integrated circuit formed with static memory (SRAM) circuits integrated on a semiconductor chip. More specifically, this invention relates to circuit configuration allowing for reduction of an operating voltage for a SRAM integrated circuit device.

2. Description of the Related Art

FIG. 33 shows a conventional type of a SRAM memory cell circuit. Symbols BL and BLB each indicates a bit line, WL a word line, Vdd a power line, and Vss a ground potential line. Further, reference numerals 111 and 112 denote a transfer transistor for access to a memory cell, 113 and 114 a driver transistor for driving a memory node for maintaining therein data for the memory cell, 115 and 116 a load transistor for supplying an electric charge for maintaining data in the memory cell, and 117 and 118 a storage node. Lowering a power voltage is the most simple and most effective method for reducing power consumption in a circuit. When a power voltage is low, however, a current in a transistor also drops, which disadvantageously causes such programs as lowering of an operating speed and degradation of operational stability.

Japanese Patent Laid-open No. 2000-114399 discloses the technique for raising a current, by connecting the back gates of a transfer transistor and a driver transistor in a SRAM memory cell and a gate, when the transistors are ON respectively. Japanese Patent Laid-open No. 2002-353340 discloses the technique for raising a current, by connecting the back gates of six transistors each constituting a SRAM memory cell and a gate, when the transistors are ON respectively. Further Japanese Patent Laid-open No. 11-16363 discloses the technique for raising a current in each of a driver transistor and a transfer transistor in a SRAM memory cell with a word line activated therein, by connecting back gates (or layers under a buried oxide film when an SOI (Silicon on Insulator) structure is used) of the transfer transistor and the driver transistor for the memory cell to a word line.

Representative examples of the pass transistor logic circuit described in Embodiment 12 are described in "PRINCIPLE OF CMOS VLSI DESIGN, A System Perspective" by Neil H. E. Weste and Kamran Eshraghin, SECOND EDITION, p. 304-307.

SUMMARY OF THE INVENTION

A power voltage for an LSI (Large Scale Integrated Circuit) has been becoming increasingly lower in association with the necessity for reduction of power consumption and size reduction of transistors therein. For instance, in the 130 nm process, an LSI operating with the power voltage of 1.2 V is manufactured. When a power voltage becomes lower, the operational stability during read/write operations in a SRAM circuit becomes lower, which disables operations in the stable state. Further also a current in each transistor constituting a memory cell becomes lower, and therefore also the operating speed becomes lower. When a driving force, namely a current for each transistor constituting a memory cell changes, also such performances as stability during read/write operations and operating speed change. Therefore, if it is possible to properly control performance of each transistor constituting a memory cell, the transistor's performance can be improved. The first and second conventional examples disclose the techniques each for realizing low voltage operations by connecting a back gate of an appropriate transistor in an SRA cell and a gate for controlling performance of the transistor. Actually, when a voltage higher than that loaded to a source node is applied to a back gate of an n-channel type bulk CMOS transistor, it is possible to control a threshold voltage (Vth) of the transistor to a low level.

However, when a voltage of about 0.5 V or more at room temperature or of about 0.2 V or more at high temperatures is loaded to a back gate of the bulk CMOS transistor, a large junction current flows at a PN junction of the transistor, which disadvantageously results in increase of power consumption. For the reason described above, in the first and second conventional examples, increase of power consumption does not occur in a circuit operating with a power voltage of 0.2 V or below. In circuits operating at a voltage higher than the value described above, however, the power consumption increases due to the junction current, which disadvantageously makes it difficult to lower power consumption. Further the third conventional example discloses the configuration in which a threshold voltage (Vth) is controlled by using a transistor having the SOI structure. In the SOI structure, by controlling a voltage in a lower layer of the buried oxide film, an unnecessary increase in current in a transistor is suppressed and Vth of the transistor can be controlled, so that a power voltage for a SRAM can be lowered by suppressing an increase in power consumption. With this configuration, however, Vth's in the driver transistor and transfer transistor drop simultaneously in association with activation of a word line. Consequently, Vth in the driver transistor connected to a storage node storing therein "H" data becomes lower, which disadvantageously spoils operational stability of the SRAM. Further capacities of back gates of the transfer transistor and the driver transistor are added to a capacity of the word line. Therefore, a parasitic capacity of the word line increases, which disadvantageously lowers the operating speed.

By forming a SRAM memory cell with SOI transistors and properly controlling an electric potential in a lower well layer of a buried Oxide (BOX) layer of each transistor to change a current flowing in each transistor, it becomes possible to improve various performances of the SRAM. Since the well layer is electrically insulated by the BOX layer from the SOI layer with transistors provided thereon, an increase in surplus leak current never occurs. When well contact is provided properly, also the memory cell area does not increase. Further, when powers corresponding to two different voltages are selectively loaded to a specified node in a memory to change a current flowing therein, performance of each transistor can be improved. In addition, a load to the word line does not increase, so that the operating speed is not lowered.

DETAILED DESCRIPTION OF THE PREFERRED EMBODIMENTS

Embodiment 1

Figure 1:
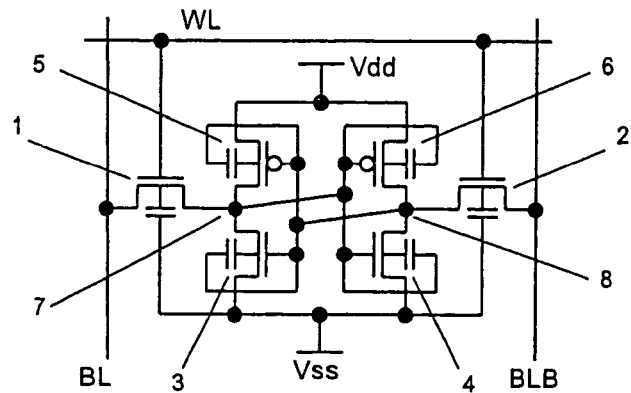
FIG. 1 is a general block diagram showing circuit configuration of a SRAM memory cell according to the present invention.
Figure 2:
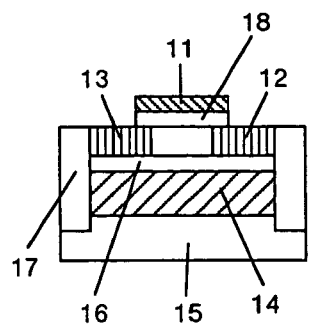
FIG. 2 is a general block diagram showing a cross section of a transistor structure used in the present invention.
Figure 3:
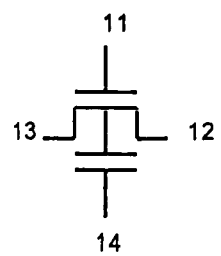
FIG. 3 illustrates an equivalent circuit of a transistor used in the present invention.

FIG. 1 is a circuit diagram showing a SRAM memory cell according to the present invention. In FIG. 1, symbols BL and BLB each indicate a bit line, WL indicates a word line, Vdd indicates a power line, and Vss indicates a ground potential line. Further reference numerals 1 and 2 each indicate a transfer transistor for access to a memory cell, 3 and 4 each indicate a driver transistor for driving a storage node for maintaining therein data for the memory cell, 5 and 6 each indicate a load transistor for supplying an electric charge for maintaining data in the memory cell, and 7 and 8 each indicate a storage node for storing data. For instance, Vdd is at an electric potential of 1.2 V, and the ground potential line Vss is at an electric potential of 0 V. FIG. 2 is a general block diagram showing a cross section of a transistor used in the circuit shown in FIG. 1. In FIG. 2, reference numeral 11 indicates a gate, 12 a drain, 13 a source, 14 a well layer under a BOX layer, 15 a support substrate, 16 a buried oxide film (BOX) layer, and 17 an element separating area. This transistor has a fully depleted SOI (FD-SOI) transistor structure. By controlling an electric potential in the well layer, a threshold voltage (Vth) of the transistor can be controlled as with controlling an electric potential in a back gate of a bulk CMOS transistor. Further the well layer is separated from a diffusion layer such as a source and a drain of a transistor with the BOX layer as an insulating film, so that a current does not flow between the well and the diffusion layer even when an electronic potential in the well is changed. FIG. 3 shows an equivalent circuit based on the transistor structure shown in FIG. 2. In this figure, reference numeral 11 designates a gate, 12 a drain, 13 a source, and 14 a well. The well is separated from a semiconductor area functioning as a back gate in a bulk CMOS transistor according to the capacity. This well 14 is described hereinafter as a back gate in the transistor shown in FIG. 3. In FIG. 1, a transistor having this structure is used.

Next a read operation is described below with reference to a case where "L" data is stored in a storage node 117 and "H" data is stored in a storage node 118 in the memory cell shown in FIG. 33. When the read operation is performed, the bit lines BL and BLB are pre-charged to an electric potential of "H". When an electric potential in the word line WL is set to "H" after pre-charging, transfer transistors 111 and 112 are turned ON and the electric potential of the bit line BL, preset to be of "H", is discharged from the transistor 111 through the storage node 117 and the driver transistor 113. Then, when the electric potential of the bit line BL is raised to a level at which the electric potential can be amplified by a sense amplifier, a sense amplifier, not shown, connected to the bit line is booted, whereby data stored in the memory cell is amplified and outputted. Focusing on the route through which the electric charge of the bit line is discharged, an electric potential in the storage node 117 is at the "L" level, namely 0 V until just before start of the read operation. When the read operation is started, however, a section between the bit line BL and the ground potential line Vss is resistively divided by the transfer resister 111 and driver transistor 113. As a result, the electric potential in the storage node 117 is set to a positive electric potential such as 0.3 V. When the electric potential becomes higher, conductance of an nMOS transistor with a gate thereof connected to the storage node 117 becomes higher, while conductance of a pMOS transistor with a gate thereof connected to the storage node 117 becomes lower. Therefore the electric potential of the storage node 118 having been set at the "H" level becomes lower. Further a rise in the electric potential in the storage node 118 is fed back to the storage node 117, and with repetition of this operation, data stored in the memory cell is destroyed. The ordinary memory cell is designed so that a ratio of conductance of the driver transistor to that of the transfer transistor will be as large as 1.5 or more. Therefore the electric potential in the storage node 117 never rise to a level at which data stored in the memory cell is destroyed. However, in association with the recent tendency in which a transistor production process is divided to more and more minute steps, variations in performance among transistors has been becoming larger. In addition, sometimes memory cells each having a lower conductance ratio as compared to that in designing are produced, which in turn results in the tendency of lower operational stability during a read operation. When a power voltage is dropped for power saving, a logical threshold voltage in an inverter formed with an nMOS transistor with the gate connected to the storage node 117 and a pMOS transistor drops. Consequently, feedback destroying data is liable to occur, which also lowers the operational stability during the read operation.

Figure 33:
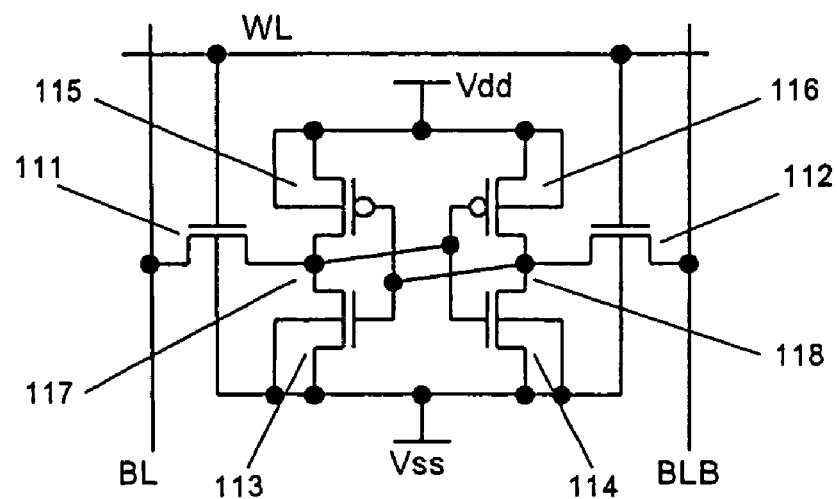
FIG. 33 is a general block diagram showing circuit configuration of a SRAM memory circuit based on the conventional technology.

In the circuit according to the present invention shown in FIG. 1, when data for "L" is stored in the storage node 7 and data for "H" in a storage node 8, the read operation is performed almost similarly to that shown in FIG. 33. However, a back gate of the driver transistor 3 is connected to a gate, so that the so-called forward bias is loaded to the driver transistor 3, and Vth of the driver transistor 3 becomes lower with the conductance raised. When the work line is turned ON, therefore, a rise of an electric potential in the storage node 7 becomes further smaller. In addition, in this state, forward bias is loaded to the load transistor 6, but an electric potential of a back gate of the driver transistor 4 is equal to a source voltage. Therefore, a logical threshold voltage in an inverter formed with the load transistor 6 and driver transistor 4 is higher as compared to that when forward bias is not loaded to the load transistor 6. Consequently, even when an electric potential in the storage node 7 rises, a feedback destroying data seldom occurs. As described above, the configuration in which back gates of a load transistor and a driver transistor are connected to a gate has excellent operational stability during the read operation, is resistant to variations of performances among transistors, and therefore is suitable to operations at a low voltage. Further in the present invention, when a gate and a back gate are connected to each other, even if a voltage of, e.g., 1.2 V is loaded in the forward direction, a current does not flow from a well to the diffusion layer because of the insulating film. Therefore, even a voltage of as high as 0.5 V or more at which the PN junction is turned ON can be applied without causing increase in power consumption.

Figure 4:
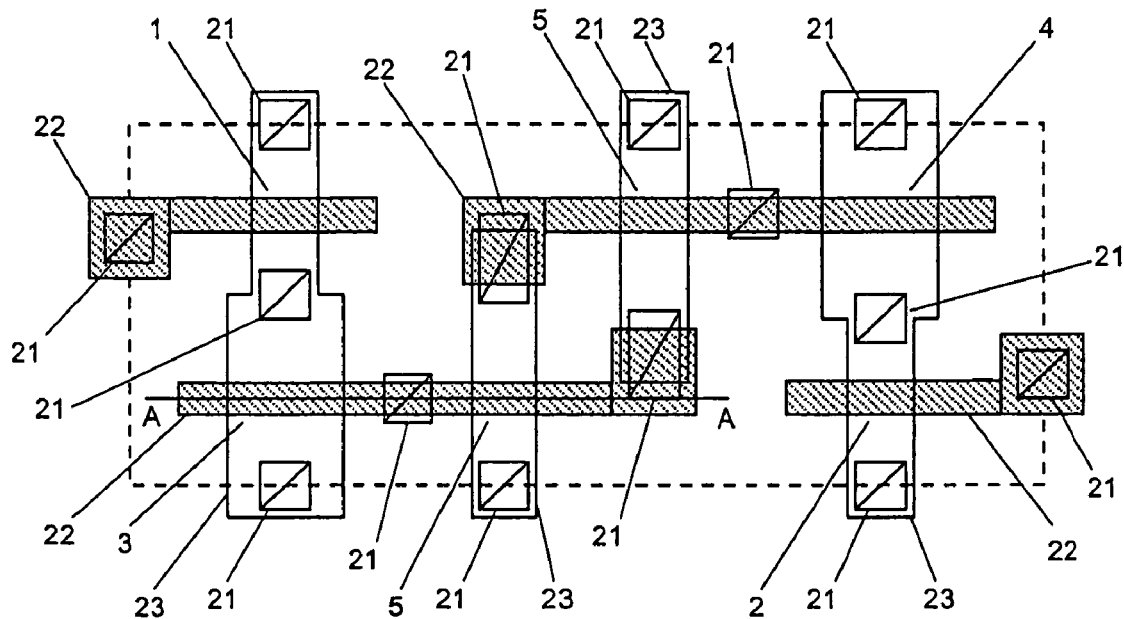
FIG. 4 is a general block diagram showing a layout of the SRAM memory cell according to the present invention.

FIG. 4 shows layout of the memory cell. In FIG. 4, reference numerals 1 and 2 each designate the transfer transistor, 3 and 4 the driver transistor, 5 and 6 the load transistor, 21 a contact, 22 a gate node, 23 a diffusion zone. A range enclosed with a dotted line indicates a memory cell. With a contact positioned under a gate node between a driver transistor and a load transistor sharing a common gate, the gate and the back gate are connected to each other.

Figure 5:
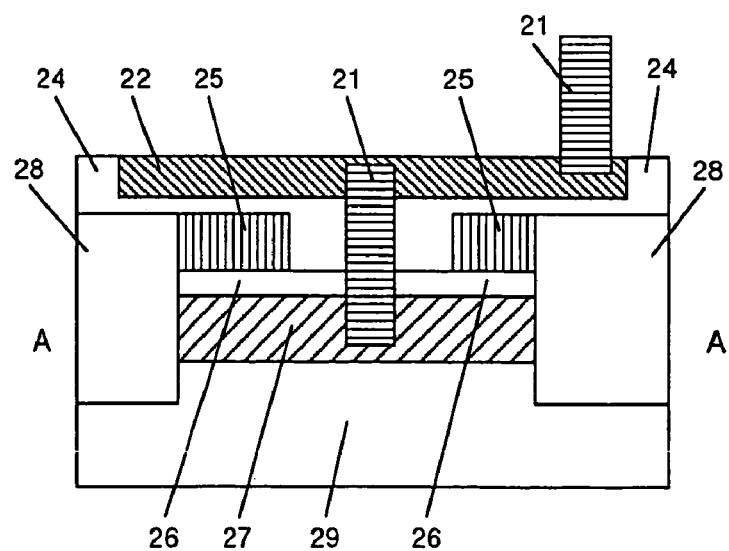
FIG. 5 is a cross-sectional view of the SRAM memory cell according to the present invention.

FIG. 5 is a general block diagram showing a cross section of the memory cell taken along line A-A in FIG. 4. In FIG. 5, reference numeral 21 denotes the contact, 22 the gate node, 24 an insulating film, 25 a SOI layer, 26 a buried oxide film, 27 a well layer, 28 a element separating layer, and 29 a support substrate. The SOI layer on which a channel is formed is separated by the buried oxide film from a well layer. With this configuration, even when forward bias is loaded to the well layer in the bulk CMOS transistor, a current does not flow from the well to the source node. Further the gate and back gate are connected to each other in the state where the gate and back gate are insulated and separated from other nodes.

Figure 6A:
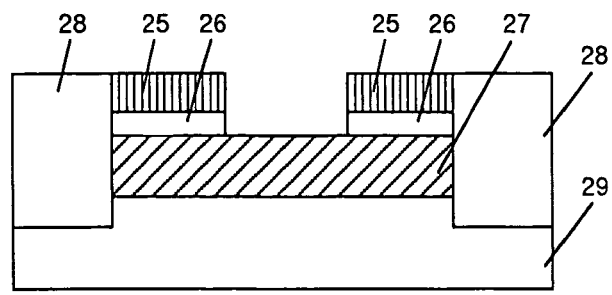
FIGS. 6A through 6E are schematic diagrams showing steps in production of a memory cell according to the present invention.
Figure 6B:
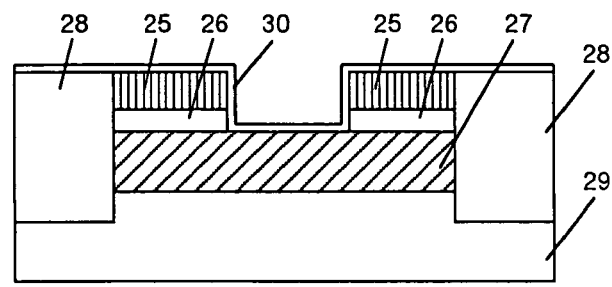
Figure 6C:
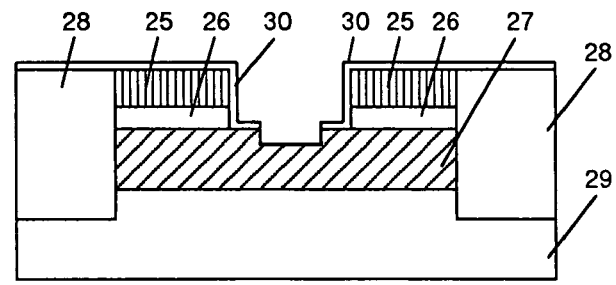
Figure 6D:
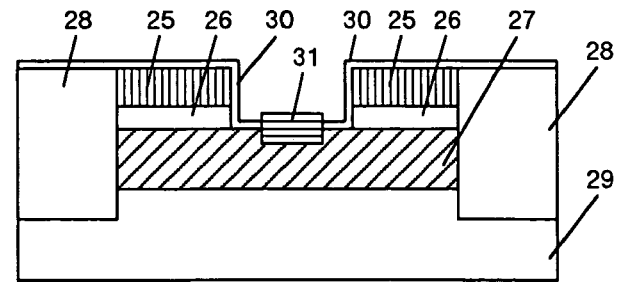
Figure 6E:
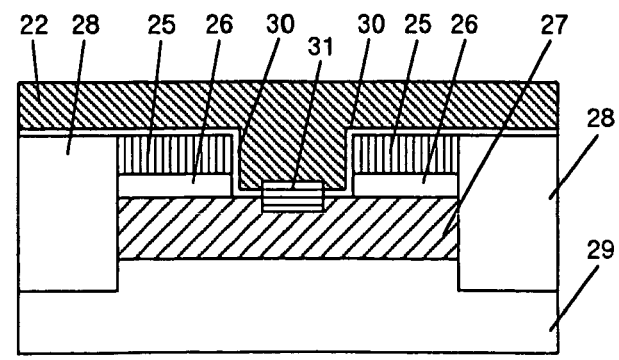

FIGS. 6A through 6E are diagrams showing outline of processes for producing a memory cell having the cross section as shown in FIG. 5 step by step. In FIGS. 6A through 6E, reference 25 denotes the SOI layer, 26 the buried oxide film, 27 the well layer, 28 the element separating layer, 29 the support substrate, 30 an insulating film, and 31 a metal contact. FIG. 6A shows the state after the element separating layer is formed. When an oxide film made of such a material as $SiO_2$ is formed on a surface thereof, the state shown in FIG. 6B is provided. In this state, when a contact hole is formed by etching or the like, the state as shown in FIG. 6C is provided. When a metallic material as a contact material such as tungsten is deposited on the contact hole, the state shown in FIG. 6D is provided. Further, when a gate node is formed on the contact hole in the state shown in FIG. 6D, the state shown in FIG. 6E is provided in which the back gate and the gate node are connected to each other.

Assuming that "H" data is stored in the storage node 117 and "L" data in the storage node 118 in the memory cell shown in FIG. 33, a description is made of an operation for writing "L" data in the storage node 117 and "H" data in the storage node 118. In this operation, the bit line BL is set to the "L" level and bit line BLB to the "H" level, and also the word line is set to the "H" level, thereby turning ON the transfer transistor. An electric charge in the storage node 117 is discharged from the transfer transistor 111, and an electric potential in the storage node 117 drops from the "H" level. When the electric potential of the storage node 117 drops to a level lower than a logical threshold voltage in an inverter formed of the load transistor 116 and the driver transistor 114, an electric potential in the storage node 118 having been at the "L" level rises, an also, a feedback between the storage nodes is effected. Thus, new data is written in the memory cell. As described above, in the SRAM memory cell, data write is performed by discharging an electric charge in a storage node at the "H" level with a transfer transistor. However, since an electric charge is supplied from a load transistor simultaneously when the electric charge is discharged by the transfer transistor, it is necessary for the transfer transistor to draw out an electric charge more than that fed from the load transistor. Because of this necessity, when conductance of the load transistor becomes larger, the time required for writing data becomes larger. In addition, when the conductance is larger than a design value due to variations in performance of transistors or the like, sometimes the operation for data write may be disabled. To overcome this problem, it is necessary to make smaller conductance of the load transistor or to make larger conductance of the transfer transistor.

Figure 14:
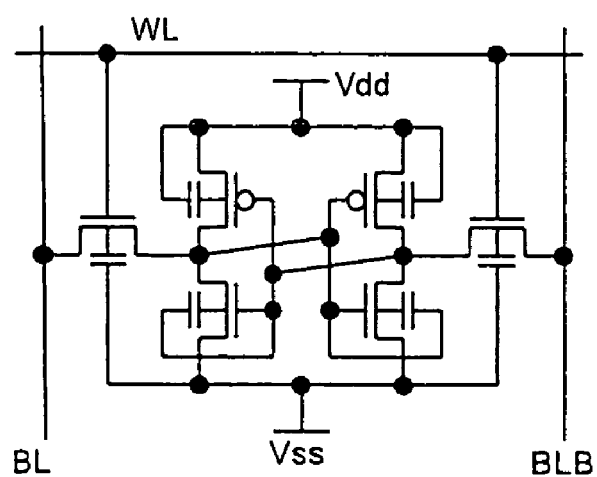
FIG. 14 is a general block diagram showing circuit configuration of the SRAM memory cell according to the present invention.

In this embodiment, since the back gate of the load transistor is connected to the gate to increase the conductance, the time required for data write is longer as compared to that in a memory cell based on the conventional technology. In general, when data is read out, data is amplified by booting an sense amplifier after the memory cell is driven, and the data is outputted. However, the operation for writing data is terminated at a point of time when data in the memory cell changes, so that the data write operation may be performed within a longer period of time. Therefore a problem seldom occurs relating to prolonging the data write time. In a case where a problem arises in that the data write time is delayed, the data write time can be shortened by employing the configuration of a memory cell as shown in FIG. 14. With this configuration, since a back gate of the driver transistor is connected to the gate as with the case shown in FIG. 1, the stability during a read operation is improved. At the same time, the back gate of the load transistor is connected to the source node, so that conductance of the load transistor is smaller as compared to that in the circuit shown in FIG. 1, and also the data write operation is performed at a higher speed.

Embodiment 2

Figure 7:
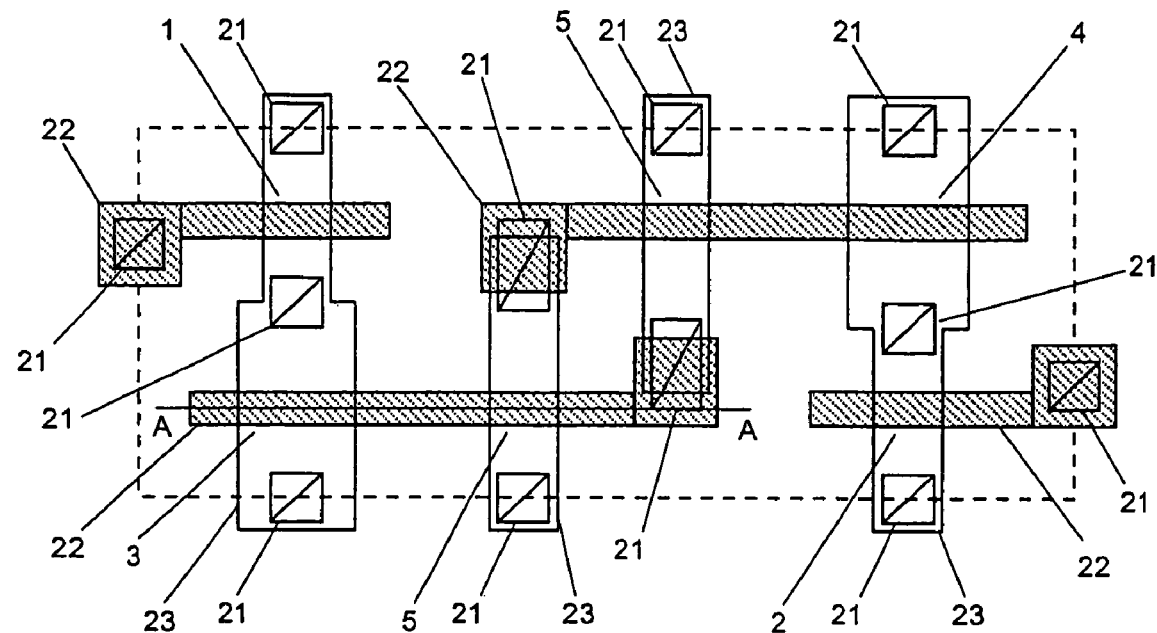
FIG. 7 is a general block diagram showing a layout of the SRAM memory cell according to the present invention.

FIG. 7 shows layout of a SRAM memory cell according to the present invention. In descriptions of the following embodiments, the same reference numerals are used for the same components as those in Embodiment 1, and a description is made only of different components. The circuit configuration of this memory cell at the transistor level is the same as that shown in FIG. 1. The layout of the memory cell shown in FIG. 7 is different from that shown in FIG. 4 only in that a back gate contact for the driver transistor as well as for the load transistor is formed below a contact for connecting the gate node to the metal layer. With this configuration, the contact formed between a driver transistor and a load transistor in the conventional technology is not necessary, so that an area of the memory cell can be reduced. In particular, when a memory cell is formed of a bulk CMOS transistor, it is necessary to separate a well for a driver transistor from that for a load transistor, so that a certain distance is required for well separation between the transistors. With the structure according to the present invention, however, the well separation is not required, so that the distance required in the conventional technology may be eliminated. Consequently, the memory cell area may be reduced as compared to that in a case where the bulk CMOS transistor is used.

Figure 8:
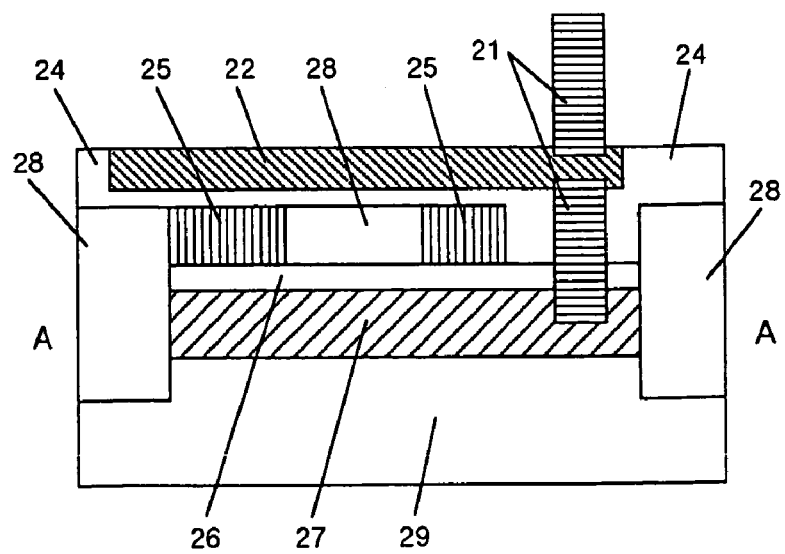
FIG. 8 is a cross-sectional view showing the SRAM memory cell according to the present invention.

FIG. 8 shows an outline of a cross section of the memory cell taken along line A-A in FIG. 7. A well layer shared by the driver transistor and load transistor is connected to a gate through the back gate contact formed under a contact connecting the gate to the upper layer. This structure can be produced through the same steps as those in FIG. 6.

Embodiment 3

Figure 9:
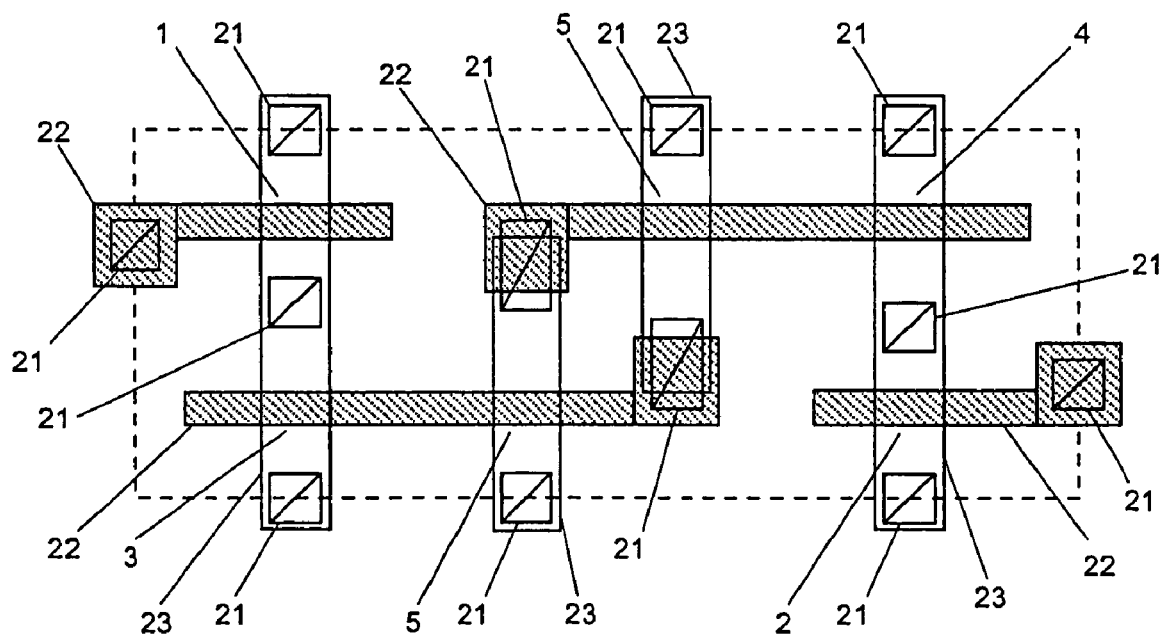
FIG. 9 is a general block diagram showing a layout of the SRAM memory cell according to the present invention.
Figure 10A:
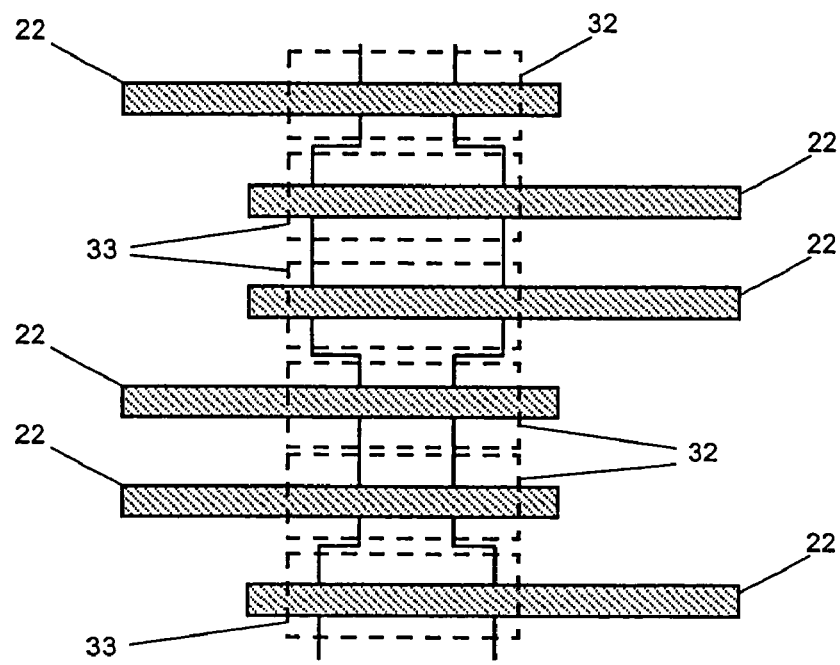
FIG. 10A is a diagram showing a layout of a memory cell and FIG. 10B shows a form of a diffusion layer after production thereof.
Figure 10B:
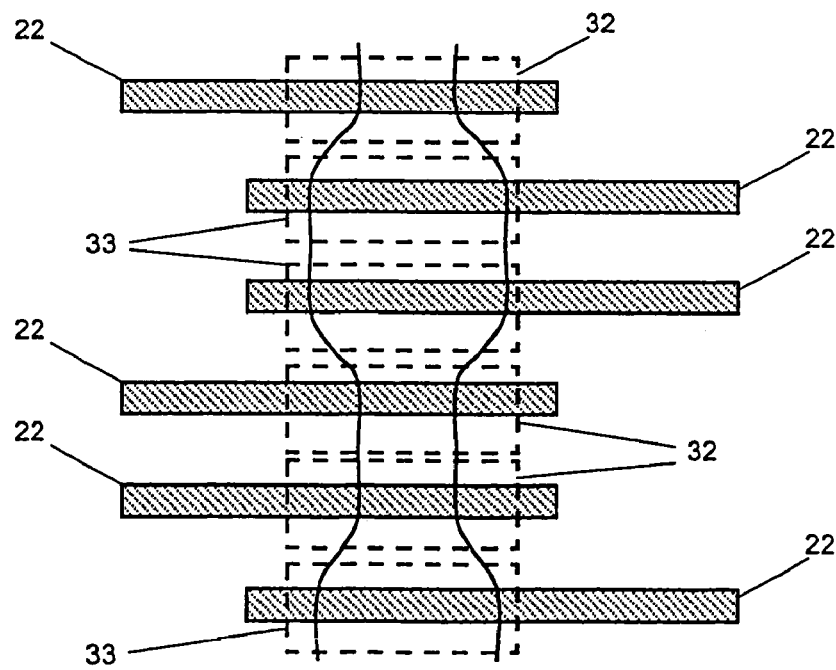

FIG. 9 shows layout of a SRAM memory cell according to the present invention. A circuit diagram of the memory cell shown in FIG. 9 at the transistor level is the same as that shown in FIG. 1. The memory cell shown in FIG. 9 is different from that shown in FIG. 1 only in that a gate width (W-size) of the driver transistor is the same as that of the transfer transistor. In the SRAM memory cell, as described in Embodiment 1, it is generally necessary, for the purpose of preventing an electric potential of a storage node at the "L" level from rising, that conductance of the driver transistor is larger than that of the transfer transistor. In a memory cell using a bulk CMOS transistor, the conductance is generally adjusted by controlling the W-size. The W-size of the driver transistor is set to a value about 1.5 times larger as compared to that of the transfer transistor. In this embodiment, the conductance when a back gate of the driver transistor is connected to the gate and the driver transistor is ON is larger than that of the transfer transistor. Consequently, it is not necessary to adjust conductance according to the W-size, and the W-size of the driver transistor may be equalized with that of the transfer transistor. The greatest advantage provided by the equality of the W-size of the driver transistor with that of the transfer transistor is that irregularities on the rectangular surface of diffusion layers, namely, the edge faces of the diffusion layers of the driver transistor and transfer transistor each having a rectangular face are eliminated. That is, the edge face of the diffusion layer can be formed linear. In the layout based on the conventional technology, the diffusion layer has irregularities each bending with perpendicularity. The diffusion layer and the gate node in the layout described above is shown in FIG. 10A. In this figure, reference numeral 32 denotes a transfer transistor, and 33 a driver transistor. A form of the diffusion layer when an LSI having the layout as described above is actually produced is shown in FIG. 10B. Also the gate node is shown for reference in the figure. When the transistor is actually produced, the gate node has a roundish form, but the form is shown as a rectangular one in this figure for simplification. In the diffusion layer actually produced, irregularities are present on an edge face of the diffusion layer. However, unlike the state shown in the layout diagram, the edge of the diffusion layer does not bend perpendicularly, and has a roundish form. When a form of the diffusion layer is as shown in the figure, the gate node may slightly move in the vertical direction, for instance, due to displacement of a mask during the production process. Alternatively, a form of an edge of the diffusion layer may change even a little. In these cases, the gate width changes from the design value, which will cause degradation of performance of the SRAM memory cell. In the layout shown in this embodiment, an edge of a diffusion layer has a completely linear form, so that irregularities seldom occur on the diffusion layer edge. In addition, even when the gate node moves in the vertical direction a little, the design value for the gate width can be maintained. Because of this feature, the memory cell in this embodiment is relatively little affected by variations of produced transistors, and degradation of performance of the memory cell seldom occurs. Further in the prior art-based memory cell using a balk CMOS transistor, it is necessary to provide a certain W-size ratio between the driver transistor and transfer transistor. Therefore, even if a transfer transistor is produced with the minimum W-size allowable in actual production, a W-size of the driver transistor is required to be larger than that of the transfer transistor. In this embodiment, both the driver transistor and transfer transistor can be produced with the minimum W-sizes allowable in actual production respectively. As a result, it is possible to produce a memory cell having a smaller area than that of other memory cells based on the prior art.

Embodiment 4

Figure 11:
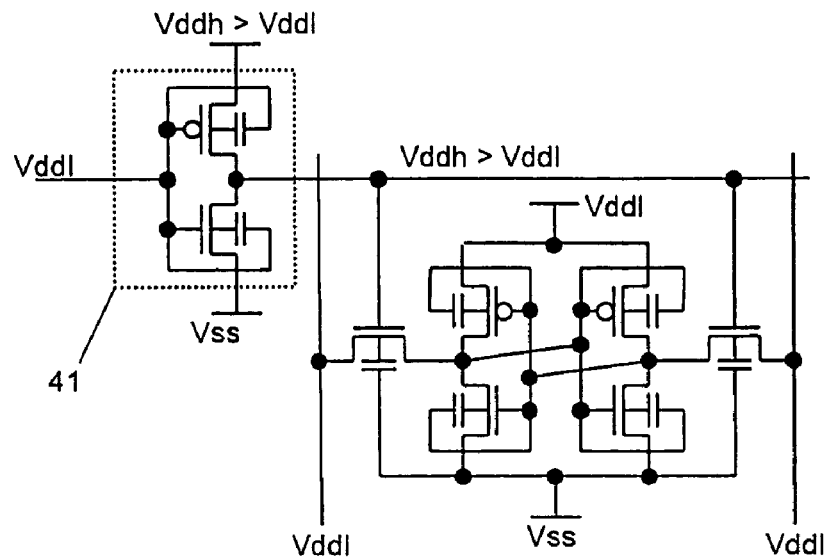
FIG. 11 is a general block diagram showing circuit configurations of the SRAM memory cell and a word driver according to the present invention.

FIG. 11 is a circuit diagram showing a SRAM memory cell according to the present invention. Symbol Vddh indicates a power voltage higher than that indicated by symbol Vddl.

Now suppose that the power voltage Vddh is 1.2 V when the power voltage Vddl is 1.0 V. The circuit configuration in this embodiment is the same as that in Embodiment 1, but an electric potential at the "H" level of the word line is higher than that at the "H" level of the bit line and also that in a source line of a load transistor in the memory cell. When an electric potential at the "H" level of the word line becomes higher, conductance of the transfer transistor becomes larger with a memory cell current raised, and an operating speed of the memory cell becomes faster. In the prior art-based memory cell, when conductance of the transfer transistor becomes larger, the operational stability during a data read operation disadvantageously drops. In the memory cell according to the present invention, a back gate of the driver transistor is connected to a gate, and conductance when the driver transistor is ON is large. Consequently, it is possible to prevent operational stability during the read operation from being negatively affected due to influence by the conductance of the transfer transistor increasing when the word line voltage is high. In addition, the operational stability during the read operation can therefore be highly maintained. Further, because conductance of the transfer transistor is larger, the operating speed during a write operation becomes faster. Because of the features as described above, the memory cell according to the present invention can operate at a high speed without losing the operational stability. Further in the SRAM circuit, power is consumed more in a circuit for transferring data from the bit line and memory cell to an input/output circuit lying outside the memory circuit. Specifically, a percentage of the power consumed in the word line and power line in the memory cell (a source line for a load transistor) is about 1% of the power consumed in the entire SRAM circuit. Accordingly, even when a high voltage is loaded to the word line to increase power consumption in the word line, the power consumption in the entire SRAM is little affected.

In this embodiment, a high voltage is loaded to the word line, but actually the high voltage is loaded only to a word driver 41 for driving the work line. The word driver is described as an inverter circuit formed with one n-channel type transistor and one p-channel type transistor in this embodiment. Actually there is a case where the inverter circuit is formed with a NAND circuit or a NOR circuit, and effects provided by the present invention do not change even when a circuit for the word driver is modified. Further the back gate of the inverter circuit is connected to the gate in this embodiment, but this configuration may be changed according to the performance desired in the designing step. In addition, a configuration is conceivable in which a back gate of the inverter circuit is directly connected to a power source, but the effects of the present invention does not change.

Various methods may be conceivable as a method of generating a high voltage Vddh such as increasing a voltage from the voltage Vddl with a charge pump, generating the voltage Vddh by lowering a high power voltage used in an input/output circuit, supplying two types of powers, namely a high voltage power and a low voltage power from outside of the LSI. The present invention can provide high performance of a memory cell regardless of a method employed for generating the voltage Vddh.

Further a write operation can be performed at a substantially high speed in this embodiment. When read and write operations at a higher speed are required, although not specifically illustrated, the configuration is employed in which an electric potential at the "H" level of the word line WL is made higher than the voltage Vdd in a circuit shown in FIG. 14. In this case, conductance in the load transistor does not become high, so that stability during a read operation can be improved without disabling read and write operations at a high speed.

Embodiment 5

Figure 12:
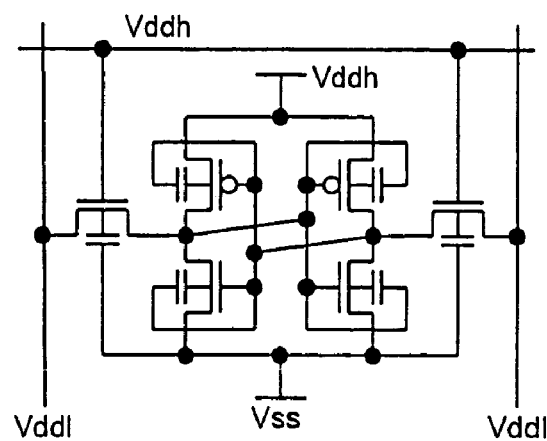
FIG. 12 is a general block diagram showing circuit configuration of the SRAM memory cell according to the present invention.

FIG. 12 is a circuit diagram showing a SRAM memory cell according to the present invention. The voltage Vddh is a power voltage higher than the voltage Vddl. The circuit configuration in this embodiment is the same as that in Embodiment 1. However, the electric potential at the "H" level of the word line and the electric potential in a source line for the load transistor in the memory cell are higher than the electric potential at the "H" level of the bit line. This embodiment is different from Embodiment 4 shown in FIG. 11 in that a power voltage for an inverter for storing data is high. Because of this feature, conductance of the driver transistor and load transistor is increased, thereby increasing the operational stability during a read operation. Thus, the operational stability and high-speed operation is achieved in this embodiment.

Figure 15:
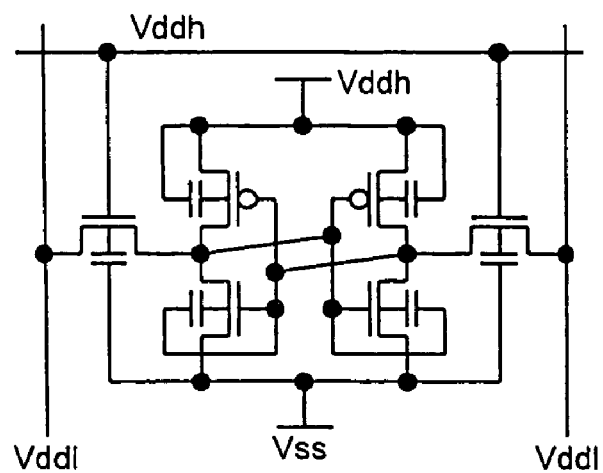
FIG. 15 is a general block diagram showing circuit configuration of the SRAM memory cell according to the present invention.

Further, because conductance of the load transistor becomes larger, when the time for data write is to be shortened, the write time for data write can be shortened by employing the circuit configuration shown in FIG. 15. In the circuit shown in FIG. 15, since a back gate of the load transistor is connected to a source node, forward bias is not loaded thereto not to increase the conductance, and therefore the write speed is improved.

Figure 36:
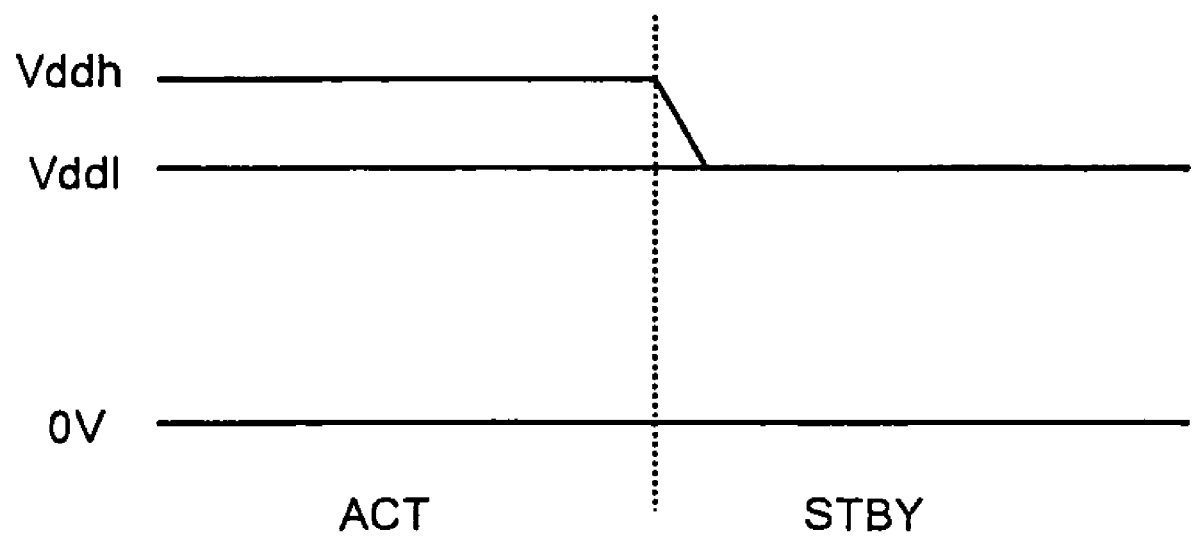
FIG. 36 is a view showing a voltage of a power for the SRAM according to the present invention.

FIG. 36 shows changes in an electric potential when an electric potential for the voltage Vdd is changed according to the state of the SRAM memory cell. In the ACT state in which the memory is accessed and activated, a voltage Vddh is higher than a voltage Vddl. In contrast, in the STBY state in which the memory cell is in the so-called stand-by state, the voltage Vddh is equal to the voltage Vddl. In the field of low power consumption LSI in which a leak current should be reduced, the fine process technology for transistors has been advanced, and in the production processes allowing for production of memory cells with the size of 90 nm or below, in addition to a sub-threshold current having been regarded as troublesome as a leak current, a gate leak current flowing through the gate oxide film is also regarded as troublesome and disadvantageous. The gate leak current drops to about 10% when a voltage loaded thereto drops by about 0.1 V. To reduce a leak current, therefore, it is important to lower a power voltage as much as possible as unnecessary. In a circuit not specifically requiring low power consumption, control over the voltage Vddh is not always necessary.

Embodiment 6

Figure 13:
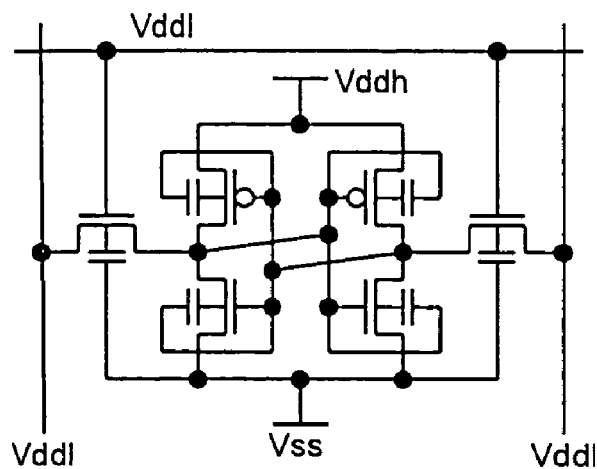
FIG. 13 is a general block diagram showing circuit configuration of the SRAM memory cell according to the present invention.

FIG. 13 shows a circuit diagram of a SRAM memory cell according to the present invention. A voltage Vddh is a power voltage higher than a voltage Vddl. The circuit configuration in this embodiment is the same as that employed in Embodiment 1, but an electric potential in a source line for a load transistor in the memory cell is higher than that at the "H" level in the bit lime as well as in the word line. As compared to Embodiment 5 shown in FIG. 12, an electric potential at the "H" level in the word line is lower. Generally in the SRAM circuit, a percentage of power consumed in the word line to all of the consumed power in the circuit is small. However, in the SRAM circuit in which a large number of word lines are activated simultaneously and a small number of bit lines are activated simultaneously, the percentage of power consumed by the word lines may be large with respect to the entire power consumption. In this embodiment, an electric potential at the "H" level of the word line is low, so that the power consumption can be suppressed to a low level. Further, since a back gate of the transistor constituting an inverter for storing data in the memory cell is connected to the gate and a high voltage is loaded to a power source for the inverter for storing the data, the operational stability during a read operation is very high in this memory cell. When the write speed is low, the write speed can be made faster by connecting a back gate of the load transistor to the source node. The voltage Vddh in this embodiment can be controlled as with that in Embodiment 5.

Embodiment 7

Figure 16:
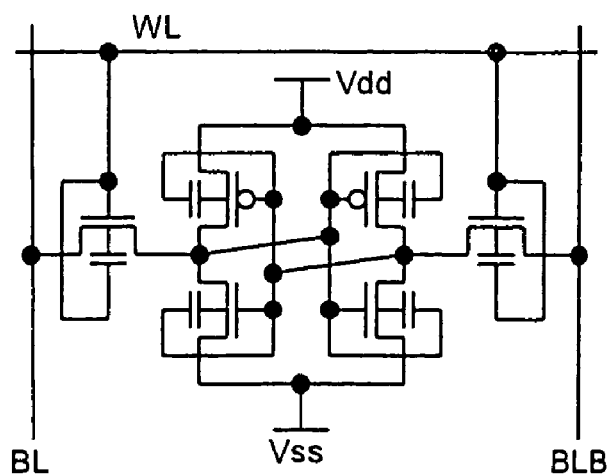
FIG. 16 is a general block diagram showing circuit configuration of the SRAM memory cell according to the present invention.

FIG. 16 is a circuit diagram showing a SRAM memory cell according to the present invention. In the memory cell shown in FIG. 16, all of back gates of six transistors each constituting the memory cell are connected to the gate nodes of the transistors respectively. Because of this configuration, the operating speed becomes faster and the operational stability is high. The circuit shown in FIG. 16 is different from the circuit in Embodiment 1 shown in FIG. 1 in that a back gate of the transfer transistor is connected to the gate node. A load to the word line in this embodiment is larger as compared to that in the circuit shown in FIG. 1. Because of this feature, when the same word driver is used, rise of the word line is slower. To quicken rise of the word line, it is necessary to use a word driver with the large size. In this case, however, because a memory cell current as a current for driving the bit line becomes large, the time required for driving the bit line is shortened. Therefore, in operations of the memory cell, when the time required for driving the bit line is longer than that required for driving the word line, the configuration in this embodiment allows operations at a higher speed.

Also in the circuit configuration in this embodiment, as described in Embodiments 1 to 6, a configuration of the memory cell is conceivable in which an electric potential at the "H" level of the word line Wl and that of the source line in the load transistor are higher than that at the "H" level of the bit line. Also in the cases described above, there are provided such advantages as an operation at a higher speed and operational stability of the memory cell. Further to enable a write operation at a higher speed, also a configuration is allowable in which a back gate of the load transistor is connected to the source node.

Figure 17:
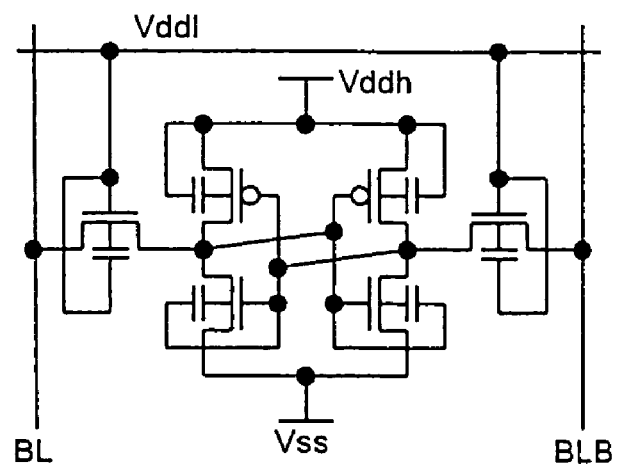
FIG. 17 is a general block diagram showing circuit configuration of the SRAM memory cell according to the present invention.

FIG. 17 shows a representative configuration in which two types of power voltages and a back gate of the load transistor are connected to the source node. In this configuration, because of the effect provided by application of a high voltage and bias of the back gate connected to the gate, conductance of the driver transistor is increased, so that the operational stability during a read operation is high and the operating speed is high. Further because of the bias effect provided by the back gate connected to the gate, also conductance of the transfer transistor is increased, which enables a high-speed operation. In addition, also since the back gate is connected to the source node, the conductance of the load transistor is prevented from rising excessively, whereby a write operation is performed at a higher-speed.

Figure 18:
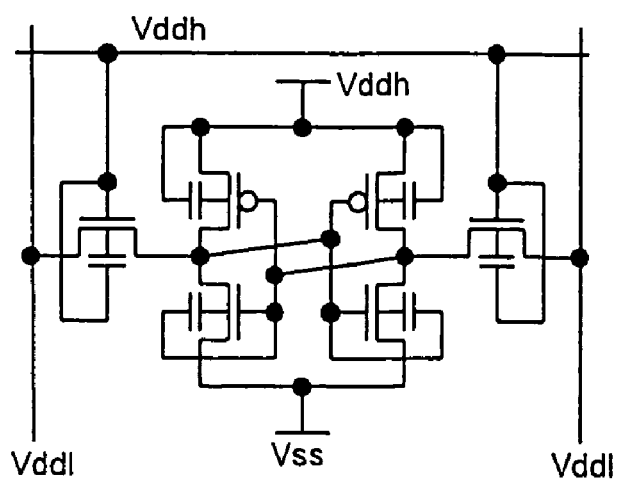
FIG. 18 is a general block diagram showing circuit configuration of the SRAM memory cell according to the present invention.

FIG. 18 shows a circuit employing the configuration in which an electric potential at the "H" level of the word line is changed to a voltage higher than that shown in FIG. 17. Because conductance of the driver transistor is sufficiently high owing to the effect provided by a high voltage and connection of the back gate to the gate, the operational stability during a read operation is preserved even when conductance of the transfer transistor is made higher. Further since conductance of the transfer transistor is high, also the operating speed is high.

Embodiment 7

Figure 19:
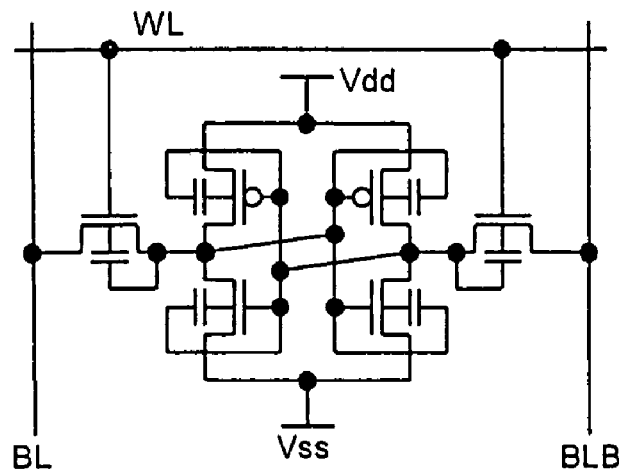
FIG. 19 is a general block diagram showing circuit configuration of the SRAM memory cell according to the present invention.

FIG. 19 is a circuit diagram showing a SRAM memory cell according to the present invention. The circuit of the memory cell shown in FIG. 19 is different from that in Embodiment 1 shown in FIG. 1 in that a back gate of the transfer transistor is connected to the source node. With this configuration, the voltage Vth of the transfer transistor connected to the storage node in which the "H" data is stored becomes low. Therefore, a speed of a write operation is increased in which an electric potential at the "H" level is lowered to "L". Further since the voltage Vth of the transfer transistor connected to the storage node in which the "H" data is stored is low, also a read operation can be performed by precharging to a voltage which is equal to about a half (½) of the power voltage as with a case where a DRAM is used. A read operation is performed by precharging a bit line with a power voltage in the ordinary SRAM circuit. In a read operation in the SRAM memory cell, an electric potential of the bit line precharged to the "H" level through a storage node for "L" data in a selected memory cell drops, and a difference from an electric potential on the contrary side drops to a design value. At this time, the sense amplifier is started to amplify the difference in electric potentials. The electric potential to be at the "H" level may drop through the storage node for storing therein "L" data in the memory cell due to a leak current from a transfer transistor in a memory cell not selected. In this case, long time is required until a difference in electric potentials is generated between bit lines. This may slow down the read speed, and in the worst case the read operation may be disabled. This phenomenon is called bit line offset. This is a problem that occurs when a voltage Vth of the transfer transistor not selected becomes lower. In the circuit in this embodiment, the voltage Vth drops only in the transfer transistor in which "H" data is stored therein, and therefore there is no leak current to the node for storing "L" data, and the problem of bit line offset does not occur.

Also in the circuit configuration in this embodiment, as described in Embodiments 1 to 6, configuration of the memory cell is conceivable in which an electric potential at the "H" level of the word line WL and that of the source line for the load transistor are higher than that at the "H" level of the bit line. Also in this case, such advantages as high-speed operations and operational stability of the memory cell are provided. Further to realize a high-speed operation during a write operation, also the configuration is allowable in which a back gate of the load transistor is connected to a source node.

Figure 20:
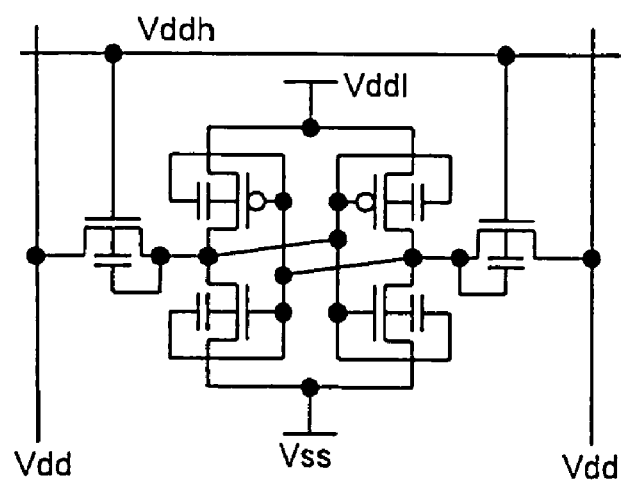
FIG. 20 is a general block diagram showing circuit configuration of the SRAM memory cell according to the present invention.

In particular, in the configuration shown in FIG. 20, an electric potential at the "H" level of the word line WL is high, so that conductance of the transfer transistor becomes larger. Therefore not only the time required for writing, but also the time required for reading can be shortened, whereby the operation speed of the entire system can be improved.

Embodiment 8

Figure 21:
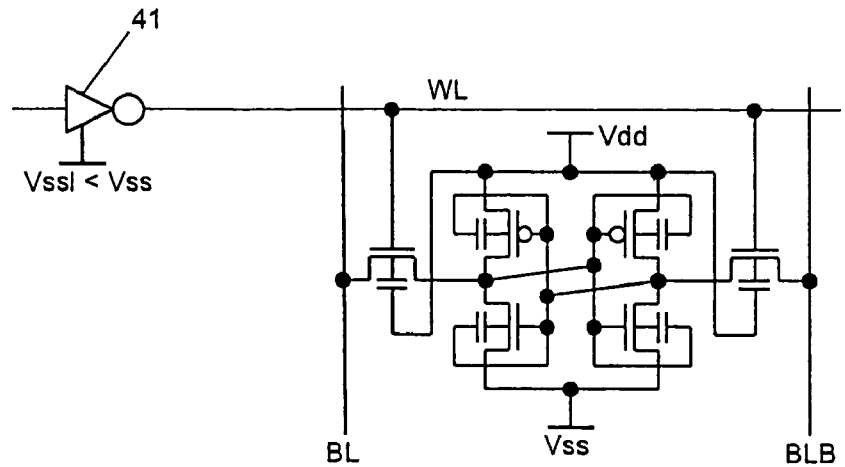
FIG. 21 is a general block diagram showing circuit configurations of the SRAM memory cell and word driver according to the present invention.

FIG. 21 is a circuit diagram for a SRAM memory cell according to the present invention. In the figure, reference numeral 41 denote a word driver, which outputs a ground potential line Vssl lower than an electric potential in the ground potential line Vss as an "L" electric potential for the word line WL. With this circuit configuration, the transfer transistor is always in the back-biased state, and the operating speed is high. However, since the transfer transistor is always in the back-biased state, a leak current from the transfer transistor is large. This poses a problem of bit line offset described in Embodiment 7, which prevents a smooth read operation. To prevent occurrence of this problem, by setting an electric potential at the "L" level of the word line to an electric potential lower than that in the Vss, a voltage difference between a gate and a source in the transfer transistor is negative, so that a leak current from the word line not selected is reduced.

In the configuration in this embodiment, an electric potential of an inactivated word line is lower than that in the Vss. Because of the high voltage Vth of the transfer transistor, the problem of bit line offset may not occur even if the voltage Vth is lowered by means of forward bias. In this case, it is not necessary to set an electric potential of the inactivated word line to a value lower than that in the Vss. This makes it possible to perform smooth operations with an electric potential equal to that in the Vss without causing any problem.

Embodiment 9

Figure 22:
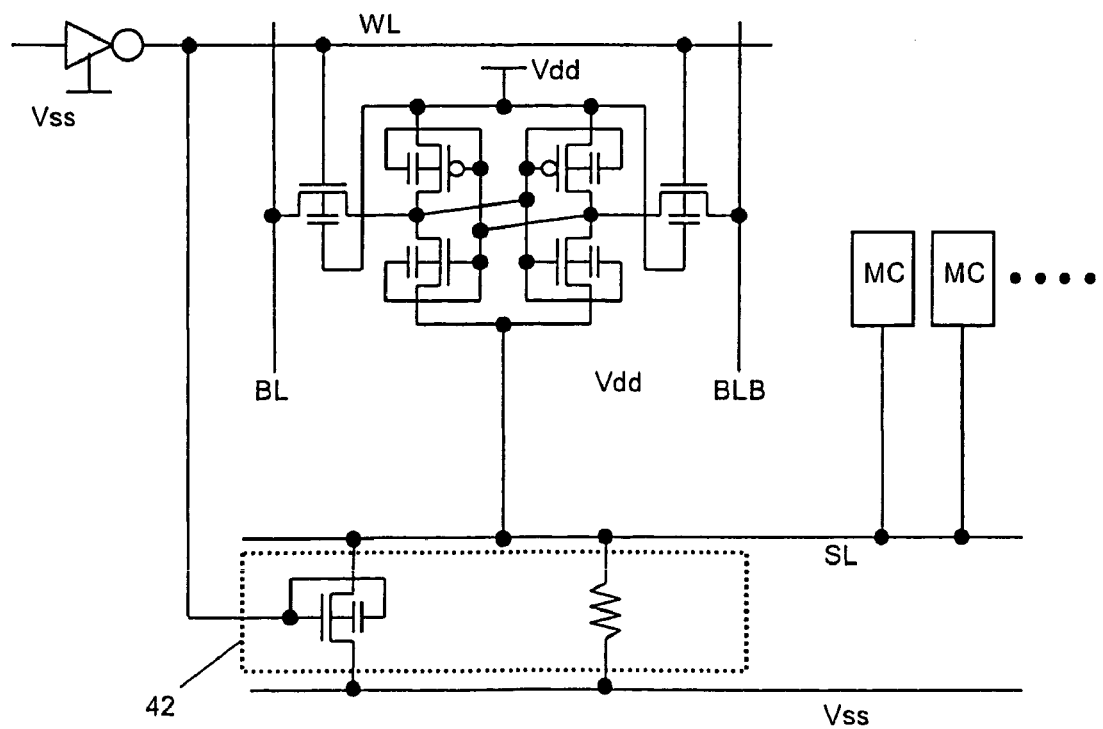
FIG. 22 is a general block diagram showing circuit configurations of the SRAM memory cell, word driver, and a source line control circuit according to the present invention.

FIG. 22 is a circuit diagram in the SRAM memory cell according to the present invention. In FIG. 22, symbol SL indicates a source line of a driver transistor in the memory cell, and all lines sharing a common word line in the memory cell are connected to the source line. Symbol MC indicates an SRAM memory cell, and reference numeral 42 indicates an electric potential control circuit. Also in this embodiment, the transfer transistor in the memory cell is in the forward-biased state, and the conductance is large and the operating speed is high. When the word line is activated, a transistor functioning as a switch in the electric potential control circuit 42 is turned ON with an electric potential in the source line SL equalized to that in the ground potential line Vss, so that the memory cell operates normally. When the word line is inactivated, the switch in the electric potential control circuit 42 is turned OFF, so that the electric potential in the SL rises from that in the Vss. In this step, the electric voltage in the S1 drops to such a low level, e.g., 0.3 V that the data stored in the memory cell is not destroyed. When an electric potential in the SL becomes high, an electric potential in the storage node storing therein "L" data in the memory cell rises. Therefore, a source electric potential in the transfer transistor connected to the storage node storing therein "L" data rises, a voltage between the gate and source in the transfer transistor is changed to a negative one, and also a voltage between the back gate and source becomes smaller. Thus, a leak current from the transfer transistor decreases. Therefore, a leak current from the transfer transistor in the inactivate state decreases. This eliminates the problem of bit line offset occurring when forward bias is loaded to the transfer transistor. Further, in FIG. 22, the electric potential control circuit 42 is formed with a n-channel type transistor functioning as a power switch and a resistor. In this circuit, also the configuration in which a diode is used in place of a resistor is conceivable because an electric potential of the SL not selected is required only to be set to such a level higher than that in the Vss that data stored in the memory cell is not destroyed. Also the configuration is allowable in which a resistor and a diode are connected to each other in parallel or in series and are provided between the SL and the Vss. Further also the configuration is allowable in which a resistor and a diode are not used and a transistor is used as a resistor or a diode to form a circuit for controlling an electric potential in the SL. As described above, various configurations are conceivable for the electric potential control circuit 42, but the same effect can be obtained insofar as an electric potential in the SL is set to a level higher than that in the Vss. Therefore the configurations are not illustrated herein specifically.

Embodiment 10

Figure 23:
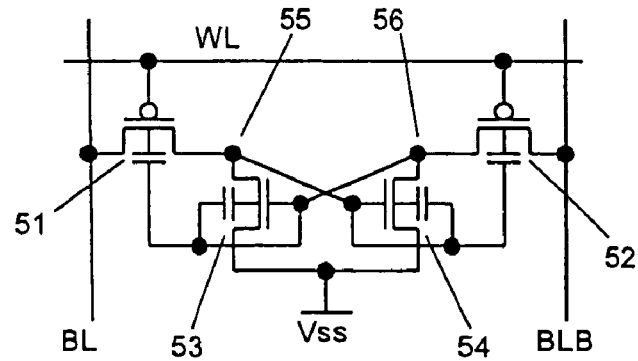
FIG. 23 is a general block diagram sowing circuit configuration of the SRAM memory cell according to the present invention.

FIG. 23 shows a SRAM memory cell circuit according to the present invention. In this embodiment, one memory cell is formed of four transistors. In FIG. 23, reference numerals 51 and 52 denotes a transfer transistor having a function to access a storage node from a bit line and also a function to charge the storage node to the "H" level, 53 and 54 a driver transistor for driving a storage node at the "L" level, and 55 and 56 a storage node for storing therein data. Symbol WL indicates a word line, BL and BLB each a bit line, and Vss a power line for "L". A description is made of data storage operations in a case where "H" data is stored in a storage node 55 and "L" data is stored in a storage node 56 in this circuit. During the operations for data storage, all of the word line WL, and bit lines BL and BLB are driven to the "H" level. In the transfer transistor 51, the back gate is set to "L" level, so that the transfer transistor 51 is in the forward-biased state with the threshold voltage Vth dropped. Because of this, a leak current flows from the bit line BL through the transfer transistor 51 to the storage node 55, and the electric potential at the "H" level in the storage node is maintained. An electric potential of the back gate of the driver transistor 53 is equal to that of the source node, so that the Vth does not change. In addition, a leak current flows only a little, and therefore the "H" level of the storage node 55 is maintained. In the driver transistor 54, an electric potential of the back gate is set to the "H" level, that is, a state of forward bias loaded thereto is established, so that the Vth drops, and therefore the "L" level of the storage node 56 can be maintained stably. A back gate of the transfer transistor 52 is set to the "H" level, so that a leak current flows only a little, and therefore the "L" level of the storage node 56 is affected little by the leak current. As described above, this memory cell operates stably, and an unnecessary leak current flows only a little in this memory cell. Layout of this memory cell is shown in FIG. 24.

Figure 24:
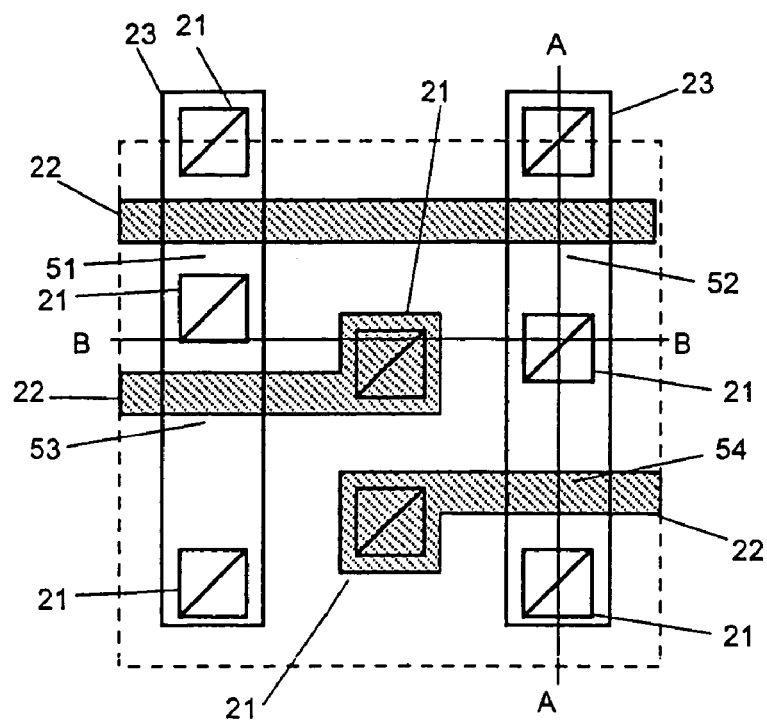
FIG. 24 is a general block diagram showing a layout of the SRAM memory cell according to the present invention.
Figure 25:
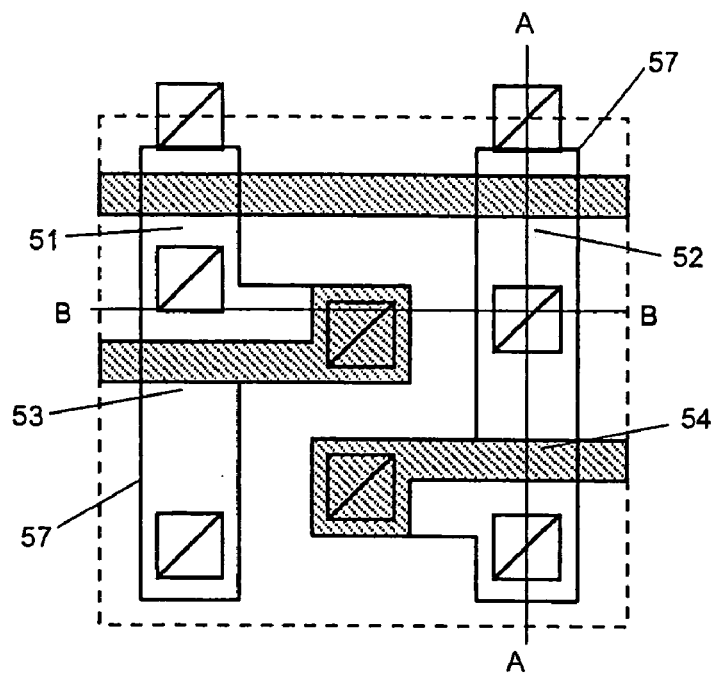
FIG. 25 is a general block diagram showing a layout of the SRAM memory cell according to the present invention.
Figure 26:
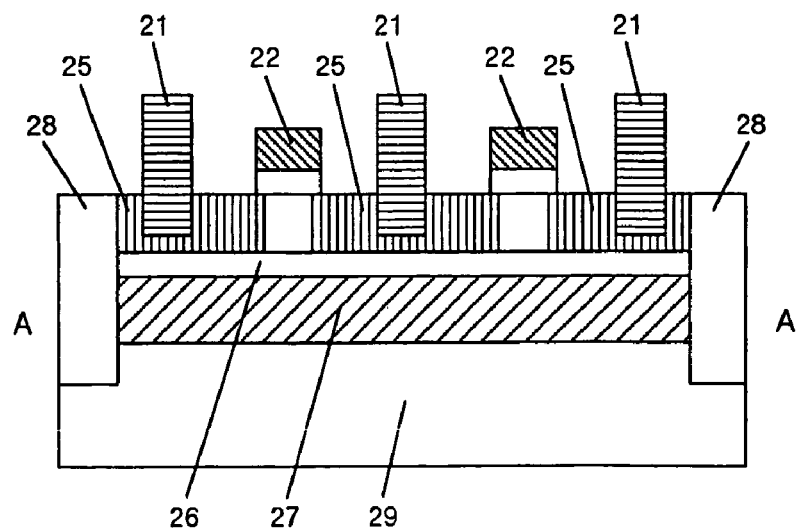
FIG. 26 is a cross-sectional view showing the SRAM memory cell according to the present invention.
Figure 27:
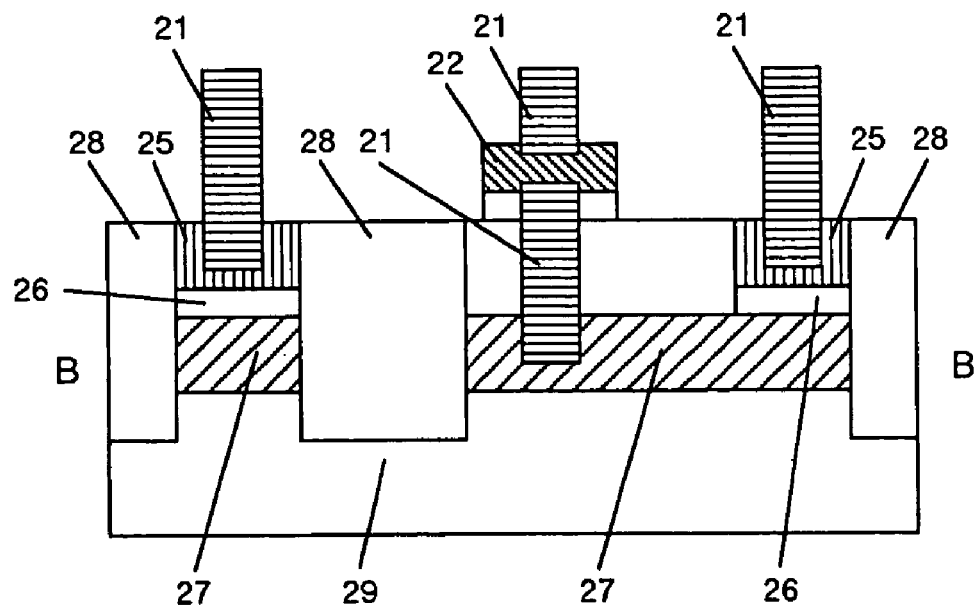
FIG. 27 is a cross-sectional view showing the SRAM memory cell according to the present invention.

In FIG. 24, reference numeral 21 denotes a contact, 22 a gate node, 23 a diffusion layer, 51 and 52 a transfer transistor, and 53 and 54 a driver transistor. A dot line indicates one memory cell. FIG. 25 shows memory cell layout, and a gate node, a contact, and a well layer are shown in the figure. Reference numeral 57 is the well layer. Wells for the transfer transistor 51 and driver transistor 53 and those for the transfer transistor 52 and driver transistor 54 are formed in the integrated state respectively and are connected to the storage node. FIG. 26 shows an outline of a cross section of the memory cell taken along line A-A in FIG. 25. This figure also clearly shows that wells for the transfer transistor 52 and driver transistor 54 are in the integrated state. FIG. 27 shows an outline of a cross section of the memory cell taken along line B-B in FIG. 25. The well contact is formed under the gate contact, and with this configuration, an increase in memory cell area caused by providing the well contact is suppressed. The well layer extends in the lateral direction from the diffusion layer to a point under the gate node of the driver transistor for storing inverse data. As described above, the memory cell in this example has only four transistors, so that the area is reduced to two thirds of the SRAM memory cell using six transistors, and therefore the area efficiency is excellent.

Embodiment 11

Figure 34:
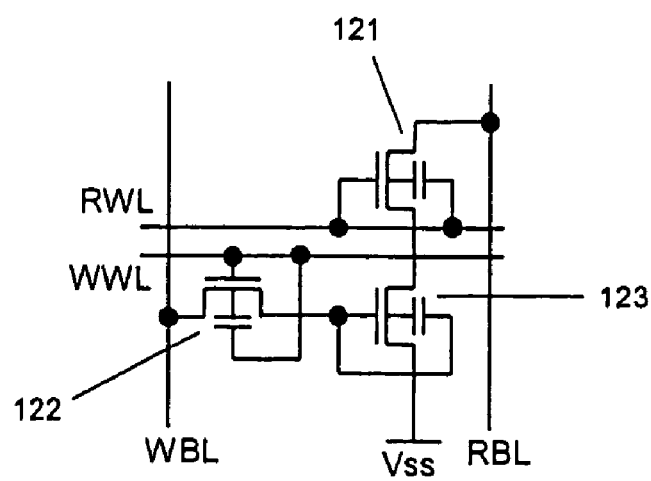
FIG. 34 is a general block diagram showing circuit configuration of a DRAM peripheral circuit according to the present invention.

FIG. 34 shows a DRAM memory cell according to the present invention. Symbol RWL indicates a word line for reading data, RBL a bit line for reading data, WWL a word line for writing data, and WBL a bit line for writing data. Reference numeral 121 denotes a read access transistor used for reading data, 122 a write access transistor used for writing data, and 123 a driver transistor for storing data. A back gate of the driver transistor has a capacity, so that a capacity for data storage is not required to be prepared specifically, which enables reduction of a memory cell area. Further a gate of the access transistor is connected to the back gate, so that the threshold voltage Vth of the transistor drops only when the transistor is ON. Therefore the stored data is hardly destroyed, which enables realization of a memory cell allowing a high access speed.

Embodiment 12

Figure 28:
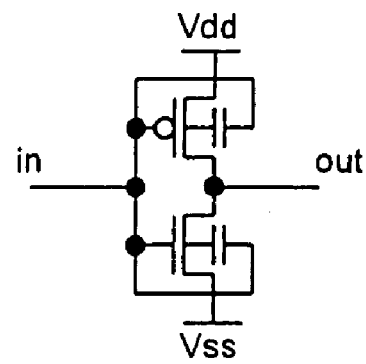
FIG. 28 is a general block diagram showing circuit configuration of a SRAM peripheral circuit according to the present invention.
Figure 29:
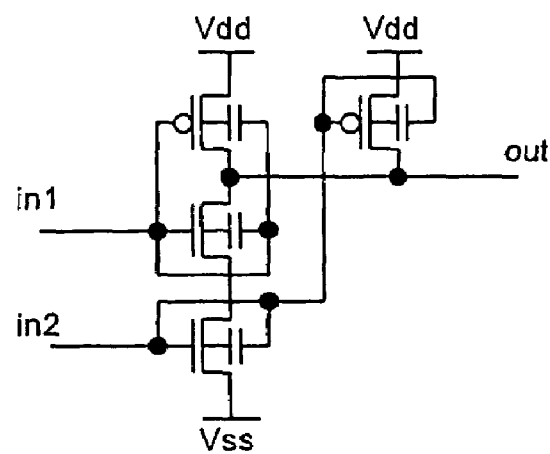
FIG. 29 is a general block diagram showing circuit configuration of the SRAM peripheral circuit according to the present invention.
Figure 30:
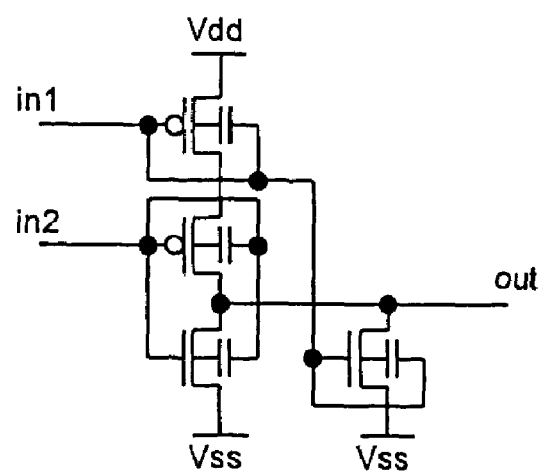
FIG. 30 is a general block diagram showing circuit configuration of the SRAM peripheral circuit according to the present invention.
Figure 31:
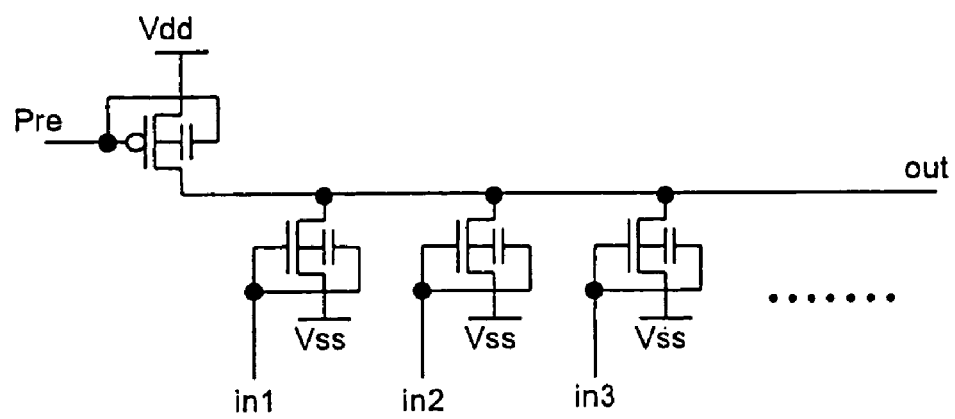
FIG. 31 is a general block diagram showing circuit configuration of the SRAM peripheral circuit according to the present invention.

FIG. 28 is a circuit diagram showing components of a circuit according to the present invention. The circuit shown in FIG. 28 is an inverter circuit, in which a gate and a back gate of the transistor constituting the circuit are connected to each other. This allows the inverter to operate at a high-speed and a leak current flows only a little therefrom. FIG. 29 is a circuit diagram showing components of the circuit according to the present invention. FIG. 29 shows a NAND circuit, in which a gate and a back gate of the transistor constituting the circuit are connected to each other. This allows the NAND gate to operate at a high-speed and a leak current flows only a little therefrom. Further n-types of transistors are stacked on each other in two stages. If this circuit is formed with a bulk CMOS transistor, an electric potential of a source node of the n-channel type transistor connected to the output terminal is higher than that in the ground potential line Vss. Consequently, the back gate bias is loaded thereto and a current is reduced with the operating speed degraded. In this embodiment, the back gate and the gate are connected, so that the transistor in the ON state is forward biased. Therefore the current does not drop, which enables high-speed operations. In this embodiment, the NAND circuit has two input terminals, but the same effect can be achieved also in the NAND circuit having three or more input terminals. FIG. 30 is a circuit diagram showing components of the circuit according to the present invention. FIG. 30 shows an NOR circuit, in which a gate and a back gate of a transistor constituting the circuit is connected to each other. This allows the NOR circuit to operate at a high-speed and a leak current flows a little therefrom. Further p-channel type transistors are stacked on each other in two stages. Therefore, if this circuit is formed with a bulk CMOS transistor, an electric potential in a source node of the p-channel type transistor connected to the output terminal is lower than that in the power line Vdd with back gate bias loaded thereto. Thus, the current drops and the operating speed is degraded. In this embodiment, since the back gate is connected to the gate, the transistor in the ON state is forward-biased. Therefore, a high-speed operation is possible without any current drop. In this embodiment, the NOR circuit has two input circuits, but also the same effect can be achieved also in an NOR circuit having three or more input terminals. FIG. 31 is a circuit diagram showing components of the circuit according to the present invention. In this embodiment, an electric potential of the node (out) pre-charged to the "H" level with a signal Pre is discharged by turning ON any of input terminals in1, in2, and in3, thus a signal being delivered. Since the back gate and gate of the n-channel type transistor to be discharged are connected to each other, the circuit operates at a high-speed. A transistor not having been turned ON is not forward-biased, so that a leak current flows little, and a voltage at the output terminal (out) does not unnecessarily drop, which provides a circuit in which a malfunction seldom occurs.

In this circuit, one n-channel type transistor is provided between the node (out) and the ground potential line Vss. However, the configuration is allowable in which two or more n-channel type transistors are provided between the node out and the ground potential line Vss. In this case, as with the NAND circuit described above, the operating speed does not drop due to back gate bias in the bulk CMOS transistor, which ensures a high-speed operation. Similarly, when the transistors are connected in series to each other, there occurs no effect by the back gate bias. Therefore, also in the pass transistor logic circuit, by using a transistor in which the gate node and the back gate node are connected to each other as with the circuit configuration as shown in FIG. 28 to FIG. 30, a high-speed operation is enabled.

Embodiment 13

Figure 32:
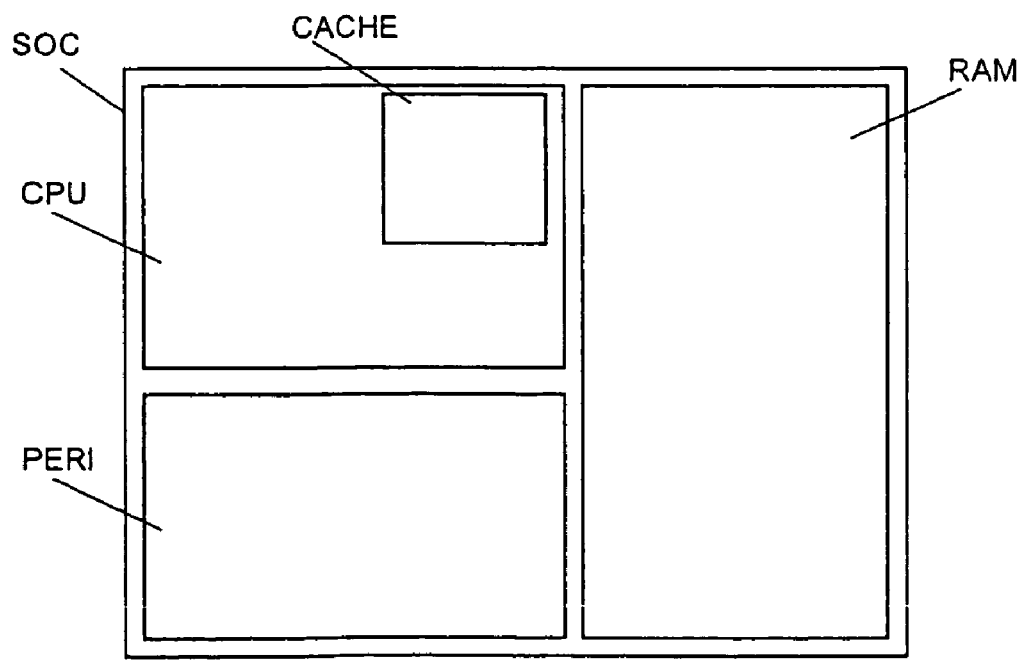
FIG. 32 is a general block diagram showing a system LSI with the SRAM according to the present invention packaged thereon.

FIG. 32 shows an outline of an LSI according to the present invention. At present, a system LSI having a CPU and a large capacity work memory with circuits for other functions packaged therein has been developed and produced. In FIG. 32, symbol CPU indicates a central processing unit (CPU) functioning as a core for a processor, CACHE a cache memory used in the CPU, RAM a large capacity work memory, and PERI a circuit having a specific function other than the CPU core. The cache memory is required to operate at the same speed as that of the CPU core, so that the capability of operating at a high-speed is required for the cache memory. Further a work memory is required to have a large storage capacity, so that an area of a work memory is required to be small. For the reasons described above, the cache memory CACHE is formed with the 6-transistor type of memory cell having a high operating speed as described in Embodiments 1 to 9 and the work random access memory RAM with the 4-transistor type of memory cell having a small area as described in Embodiment 10. This can provide a system SLI having the excellent overall performance.

Embodiment 14

Figure 35:
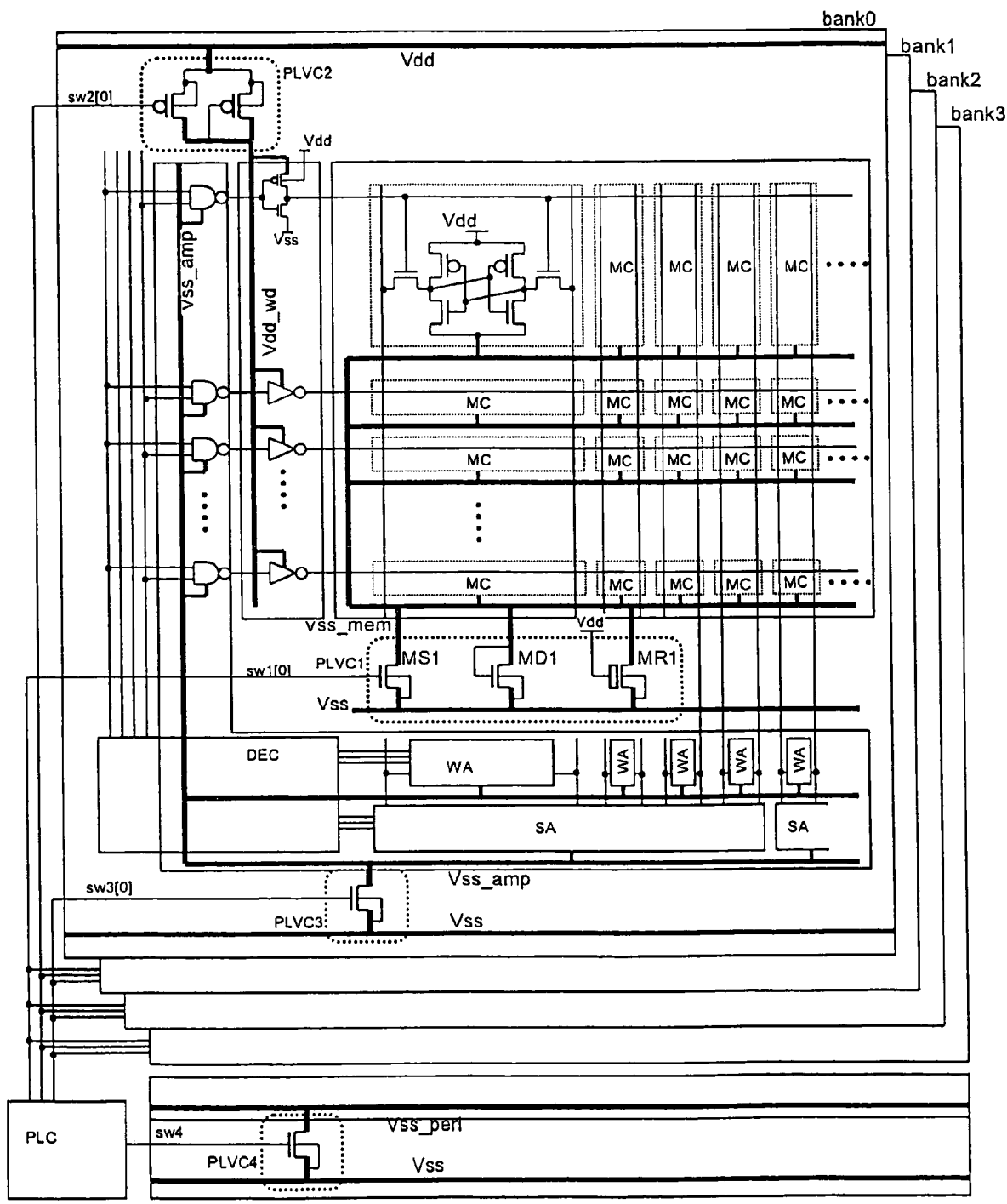
FIG. 35 is a general block diagram showing a SRAM macro according to the present invention.

FIG. 35 shows a general configuration of a low-power consumption SRAM circuit according to the present invention. Although all of the transistors used in the circuit in this embodiment each have the structure as shown in FIG. 2, but to simplify the circuit diagram, only FIG. 35 shows transistors each having a back gate with no capacity in place of the equivalent circuits shown in FIG. 3. In FIG. 35, symbols bank0 to bank3 each indicates a bank formed with memories accessed simultaneously, symbols Vss_mem, Vdd_wd, Vss_amp, and Vss_peri each indicate a power source with controlled voltage for reducing a leak current, PLVC1 to PLVC4 indicate circuits for controlling electric potentials in the power sources respectively, and sw1 to sw4 indicate signals for power sources PLVC1 to PLVC4. Symbol MC indicates a memory cell, WA an amplifier, SA a sense amplifier, DEC a peripheral circuit other than the amplifier in the memory, and PLC a circuit for controlling each circuit. In FIG. 35, the write amplifier WA is connected to each bit line, although cut off on the way to simplify the diagram. In this embodiment, the transistors in each bank are activated only when the power source of each bank is accessed, so that a leak current is reduced when the bank is not accessed. In particular, by using the memory cell described in each of Embodiments 1 to 10 as a SRAM memory cell for this circuit, a SRAM circuit is provided which has various excellent performances such as high speed operation, low leak current, and operational stability of the memory. In particular, if the Vddh control described in each of Embodiment 3 and on is employed also for power control in each bank, it is possible to build a high-speed SRAM circuit leaking a current less.

With the present invention, it is possible to provide a SRAM circuit capable of operating at a high speed under a low voltage and consuming a power less as compared to that in the conventional technology. Incidentally, symbols and reference numerals used in the figures for this patent application are as described below.

1,2,32,51,52,111,112 . . . Transfer transistor, 3,4,33,53,54, 113,114 . . . Driver transistor, 5,6,115,116 . . . Load transistor, 7,8,55,56,117,118 . . . Date storage node in memory cell, WL . . . Word line, BL, BLB . . . Bit line, Vdd . . . Power line, Vss . . . Ground potential line, 11, 12 . . . Gate node, 12 . . . Drain node, 13 . . . Source node 14, 27 . . . Well, 15, 29 . . . Support substrate, 16, 26 . . . Buried oxide film, 17, 28 . . . Element separating layer, 21, 31 . . . Contact, 23 . . . Diffusion layer, 24,30 . . . Insulating film, 25 . . . SOI layer, Vddh . . . Power line with an electric potential higher than Vddl, Vddl . . . Power line with an electric potential lower than Vddh, 41 . . . Word driver, 42 . . . SL electric potential control circuit, SL . . . Source line for driver transistor in memory cell, MC . . . Memory cell, 57 . . . Well layer in layout diagram, in, in1, in2,in3 . . . Input terminal of logic circuit, out . . . Output terminal of logic circuit, Pre . . . Pre-charge signal, SOC . . . Chip of system LSI, CPU . . . CPU core, CACHE . . . Cache memory, RAM . . . Work memory, PERI . . . Logic circuit outside CPU core in system LSI, RWL . . . Word line for reading data, RBL . . . Bit line for reading data, WWL . . . Word line for writing data, WBL . . . Bit line for writing data, 121 . . . Read access transistor, 122 . . . Write access transistor, 123 . . . Data memory driver transistor, bak0 to bank3 . . . Memory bank, Vss_msm, Vss_wd, Vss_amp, Vss_peri . . . Power source with the voltage controlled, PLVC1 to PLVC4 . . . Power electric potential control circuit, sw1 to sw4 . . . Electric potential control signal, WA . . . Write amplifier, SA . . . Sense amplifier, DEC . . . Memory peripheral circuit other than amplifier, PLC . . . Power control signal generating circuit, MS1, MD1, MR1 . . . Components of power electric potential control circuit, ACT . . . Memory cell access time, STBY . . . Memory cell non-accessed time.

While a preferred embodiment of the present invention has been described using specific terms, such description is for illustrative purpose only, and it is to be understood that changes and variations may be made without departing from the spirit or scope of the following claims.

What is claimed is:

1. A semiconductor memory including a static type memory cell comprising:

first and second driver transistors each having an FD-SOI structure in which a SOI layer is completely depleted, the first and second driver transistors being n-type transistors;

first and second storage nodes for storing data therein;

a first transfer transistor connected between one of a bit line pair for access to the memory cell and the first storage node; and a second transfer transistor connected between the other one of the bit line pair and the second storage node, wherein each of said first and second driver transistors comprises a semiconductor layer, including a well layer, formed in a semiconductor substrate, and a buried oxide film layer provided on said well layer;

wherein source nodes of said first and second driver transistors are connected to a ground potential line, wherein said well layer of the first driver transistor is connected to a gate node of the first driver transistor via a first contact which penetrates said semiconductor layer, wherein said well layer of the second driver transistor is connected to a gate node of the second driver transistor via a second contact which penetrates said semiconductor layer, wherein said static type of memory cell has only four transistors constituted by said first and second transfer transistors and said first and second driver transistors, wherein a well layer of said first transfer transistor is connected to said second storage node, wherein a well layer of said second transfer transistor is connected to said first storage node, and wherein, in said static type of memory cell, well nodes of the first transfer transistor and first driver transistor are formed integral with each other, and well nodes of the second transfer transistor and second driver transistor are formed integral with each other.

2. The semiconductor memory according to claim 1, wherein said first and second transfer transistors are p-type transistors.

3. The semiconductor memory according to claim 1, wherein, in said static type of memory cell, said well nodes of the first transfer transistor and first driver transistor are connected to a gate node of the first transfer transistor through a contact formed under a contact for connecting said gate node of the first driver transistor to a metallic wiring, and said well nodes of the second transfer transistor and second driver transistor are connected to a gate node of the second transfer transistor through a contact formed under a contact for connecting said gate node of the second driver transistor to a metallic wiring.

* * * * *